United States Patent
Bhuyan et al.

(10) Patent No.: US 11,821,085 B2
(45) Date of Patent: Nov. 21, 2023

(54) METHODS OF SELECTIVE ATOMIC LAYER DEPOSITION

(71) Applicant: Applied Materials, Inc., Santa Clara, CA (US)

(72) Inventors: Bhaskar Jyoti Bhuyan, San Jose, CA (US); Mark Saly, Santa Clara, CA (US); David Thompson, San Jose, CA (US); Tobin Kaufman-Osborn, Sunnyvale, CA (US); Kurt Fredrickson, Sunnyvale, CA (US); Thomas Knisley, Livonia, MI (US); Liqi Wu, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 122 days.

(21) Appl. No.: 17/182,906

(22) Filed: Feb. 23, 2021

(65) Prior Publication Data

US 2021/0189562 A1    Jun. 24, 2021

Related U.S. Application Data

(62) Division of application No. 16/382,643, filed on Apr. 12, 2019, now abandoned.

(60) Provisional application No. 62/801,043, filed on Feb. 4, 2019, provisional application No. 62/657,687, filed on Apr. 13, 2018.

(51) Int. Cl.
*C23C 16/455* (2006.01)
*H01L 21/02* (2006.01)

(52) U.S. Cl.
CPC .. *C23C 16/45553* (2013.01); *C23C 16/45527* (2013.01); *H01L 21/0228* (2013.01); *H01L 21/02175* (2013.01)

(58) Field of Classification Search
CPC .......... H01L 21/76826; H01L 21/28562; C23C 16/04; C23C 16/45534
See application file for complete search history.

(56) References Cited

U.S. PATENT DOCUMENTS

2010/0297474 A1* 11/2010 Dameron .............. C23C 16/403
427/126.4
2011/0244680 A1  10/2011 Tohnoe et al.
2015/0137333 A1   5/2015 Marsh
(Continued)

OTHER PUBLICATIONS

PCT International Search Report and Written Opinion in PCT/US2019/027183, dated Aug. 7, 2019, 10 pages.
(Continued)

*Primary Examiner* — Joseph A Miller, Jr.
(74) *Attorney, Agent, or Firm* — Servilla Whitney LLC

(57) ABSTRACT

Methods of depositing a film selectively onto a first substrate surface relative to a second substrate surface are described. The methods include exposing the substrate surfaces to a blocking compound to selectively form a blocking layer on at least a portion of the first surface over the second surface. The substrate is sequentially exposed to a metal precursor with a kinetic diameter in excess of 21 angstroms and a reactant to selectively form a metal-containing layer on the second surface over the blocking layer or the first surface. The relatively larger metal precursors of some embodiments allow for the use of blocking layers with gaps or voids without the loss of selectivity.

20 Claims, 2 Drawing Sheets

(56) References Cited

U.S. PATENT DOCUMENTS

| | | | |
|---|---|---|---|
| 2015/0217330 A1* | 8/2015 | Haukka | C23C 18/1208 |
| | | | 427/343 |
| 2015/0299848 A1* | 10/2015 | Haukka | C23C 16/402 |
| | | | 427/256 |
| 2017/0040164 A1* | 2/2017 | Wang | H01L 21/02315 |
| 2017/0092533 A1 | 3/2017 | Chakraborty et al. | |
| 2017/0141295 A1 | 5/2017 | Ekerdt et al. | |
| 2017/0256402 A1 | 9/2017 | Kaufman-Osborn et al. | |
| 2017/0323776 A1 | 11/2017 | Farm et al. | |
| 2018/0012752 A1 | 1/2018 | Tapily et al. | |
| 2018/0370807 A1* | 12/2018 | Zhou | C23C 16/45536 |

OTHER PUBLICATIONS

Seo, Seunggi, et al., "Reaction Mechanism of Area-Selective Atomic Layer Deposition for Al2O3 Nanopatterns", ACS Publications, Sep. 2017, 11 pages.

* cited by examiner

METHODS OF SELECTIVE ATOMIC LAYER DEPOSITION

CROSS-REFERENCE TO RELATED APPLICATIONS

This application is a divisional application of U.S. patent application Ser. No. 16/382,643, filed Apr. 12, 2019, which claims priority to U.S. Provisional Application No. 62/801,043, filed Feb. 4, 2019, and U.S. Provisional Application No. 62/657,687, filed Apr. 13, 2018, the entire disclosure of which is hereby incorporated by reference herein.

FIELD

Embodiments of the disclosure generally relate to methods of enhancing selective deposition of a film. More particularly, some embodiments of the disclosure are directed to methods of enhancing selective atomic layer deposition of a film using larger diameter precursors. More particularly, some embodiments of the disclosure are directed to methods of enhancing selective atomic layer deposition of a metal oxide film using alcohols as oxidative reagents.

BACKGROUND

The semiconductor industry faces many challenges in the pursuit of device miniaturization including the rapid scaling of nanoscale features. Such challenges include the fabrication of complex devices, often using multiple lithography steps and etch processes. Furthermore, the semiconductor industry needs low cost alternatives to high cost EUV for patterning complex architectures. To maintain the cadence of device miniaturization and keep chip manufacturing costs down, selective deposition has shown promise. It has the potential to remove costly lithographic steps by simplifying integration schemes.

Selective deposition of materials can be accomplished in a variety of ways. For instance, some processes may have inherent selectivity to surfaces based on their surface chemistry. These processes are rare, and typically specific to the reactants used, materials formed and the substrate surfaces.

Accordingly, almost all precedents to date on selective deposition have been focused on developing a better SAM (self-assembled monolayer) for enabling a high level of selectivity. Many processes for selective deposition involve rigorous activity in optimizing the SAM formation process to attain a certain extent of selectivity. It is believed that selectivity of a process depends entirely on crystallinity of the SAM. The process of achieving crystalline SAMs is lengthy and, in some cases, can take hours to achieve thereby limiting the effective throughput of the process.

The central challenge in achieving high quality selective deposition is minimizing defects (e.g., pin holes) in the SAM layer which are prone to deposition causing unwanted device defects. These pinholes are the primary cause of selectivity failure. A higher quality SAM layer can minimize pinholes thereby reducing defects, however, this process can take hours limiting the feasibility of the SAM based process.

Therefore, there is a need in the art for methods of selective deposition which do not require a defect free SAM.

Hafnium oxide (HfOx) is commonly used as high k material in nano fabrication. The selective deposition of HfOx on metal materials but not on dielectric materials (e.g. silicon oxide) reduces the number of processing steps in smaller technology nodes.

Current methods of selectively depositing HfOx utilize TEMA-Hf (tetrakis(ethylmethylamino)hafnium) as a metal precursor and water as the oxidant. Using a SAM, these methods can achieve selectivity up to about 50-60 Å before the SAM degrades and selectivity is lost.

Therefore, there is a need in the art for methods to selectively deposit films which do not require a defect free SAM. Additionally, there is a need in the art for methods to increase selectivity of SAM-based metal oxide deposition processes.

SUMMARY

One or more embodiments of the disclosure are directed to a method of selective deposition. The methods comprise providing a substrate with a first surface and a second surface. The substrate is exposed to a blocking compound to selectively form a blocking layer on at least a portion of the first surface over the second surface. The substrate is sequentially exposed to a metal precursor and a reactant to selectively form a metal-containing layer on the second surface over the blocking layer or the first surface. The metal precursor has a kinetic diameter of greater than or equal to about 21 angstrom.

Further embodiments of the disclosure are directed to methods of selective deposition. The methods comprise providing a substrate with a first material surface and a second material surface. The first material comprises $SiO_2$. The second material comprises copper. The substrate is exposed to n-octadecyltris(dimethylamino)silane to selectively form a blocking layer on at least a portion of the first material surface over the second material surface. The substrate is sequentially exposed to tri-tertbutyl aluminum and water to selectively form an aluminum oxide layer on the second material surface over the blocking layer or the first material surface.

Further embodiments of the disclosure are directed to methods of selective deposition. The methods comprise providing a substrate with a first material surface and a second material surface. The first material comprises $SiO_2$. The second material comprises copper. The substrate is exposed to n-octadecyltris(dimethylamino)silane to selectively form a blocking layer on at least a portion of the first material surface over the second material surface. The substrate is sequentially exposed to tetrakis(dimethylamido)titanium and ammonia to selectively form an titanium nitride layer on the second material surface over the blocking layer or the first material surface.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
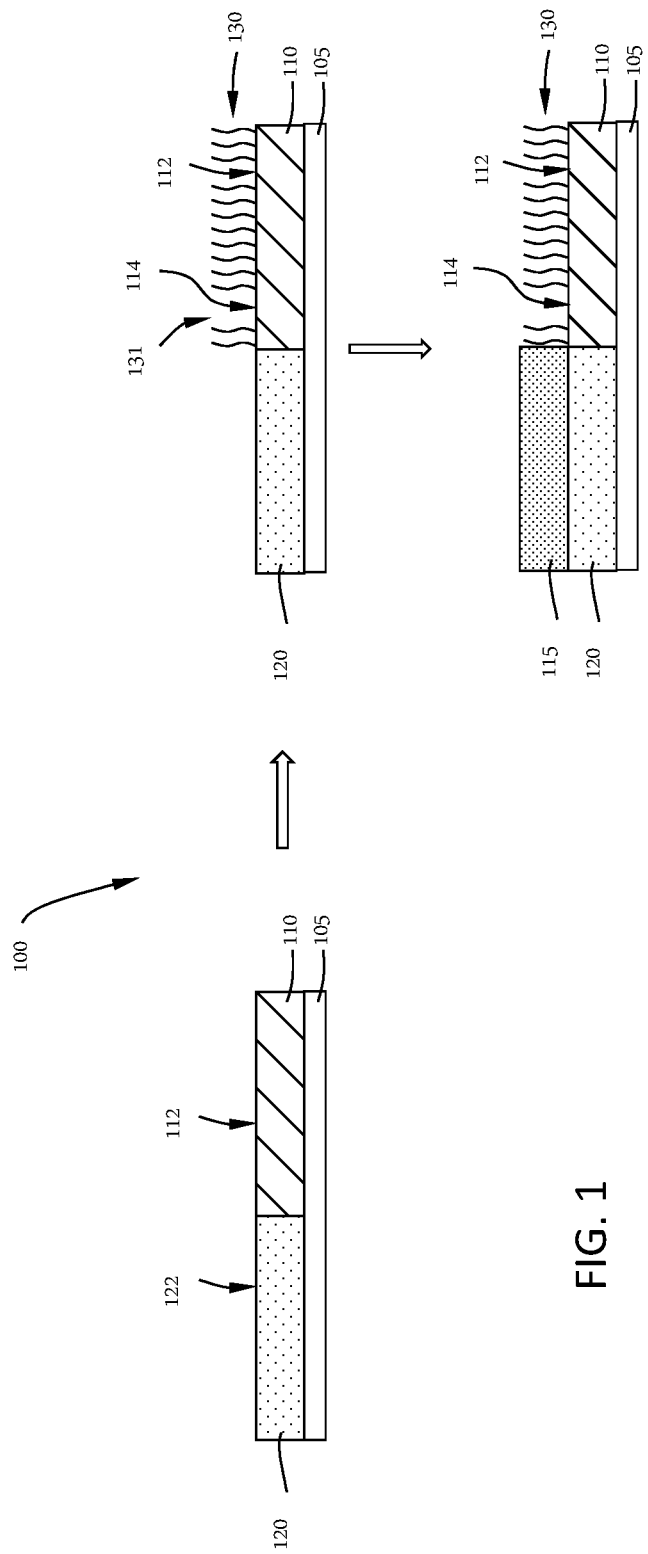
FIG. 1 illustrates a processing method in accordance with one or more embodiment of the disclosure.

As used in this specification and the appended claims, the term "substrate" and "wafer" are used interchangeably, both referring to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. What a given substrate surface comprises will depend on what films are to be deposited, as well as the particular chemistry used.

As used herein, a "patterned substrate" refers to a substrate with a plurality of different material surfaces. In some embodiments, a patterned substrate comprises a first surface and a second surface. In some embodiments, the first surface comprises a dielectric material and the second surface comprises a conductive material. In some embodiments, the first surface comprises a conductive material and the second surface comprises a dielectric material. In one or more embodiments, the first surface may comprise a metal, metal oxide, or H-terminated $Si_xGe_{1-x}$, and the second surface may comprise a Si-containing dielectric, or vice versa. In some embodiments, a substrate surface may comprise certain functionality (e.g., —OH, —NH, etc.).

As used in this specification and the appended claims, the terms "reactive gas", "precursor", "reactant", and the like, are used interchangeably to mean a gas that includes a species which is reactive with a substrate surface. For example, a first "reactive gas" may simply adsorb onto the surface of a substrate and be available for further chemical reaction with a second reactive gas.

In recent decades, the semiconductor community has made attempts to improve integrated circuit (IC) processing by replacing lithography steps with alternatives that translate to lower cost, reduced processing time, and smaller feature sizes. Many of these alternatives fall under the blanket category of "selective deposition." In general, selective deposition refers to a process for which the net deposition rate is higher on the target substrate material relative to other substrate materials, such that the desired film thickness is achieved on the target substrate material with less or negligible deposition on the other substrate materials (where "negligible" is defined by process constraints).

Embodiments of the disclosure provide methods of selectively depositing a film onto one surface over a second surface. As used in this specification and the appended claims, the term "selectively depositing a film on one surface over another surface", and the like, means that a first amount of the film is deposited on the first surface and a second amount of film is deposited on the second surface, where the second amount of film is less than the first amount of film, or no film is deposited on the second surface. The term "over" used in this regard does not imply a physical orientation of one surface on top of another surface, rather a relationship of the thermodynamic or properties of the chemical reaction with one surface relative to the other surface. For example, selectively depositing a cobalt film onto a copper surface over a dielectric surface means that the cobalt film deposits on the copper surface and less or no cobalt film deposits on the dielectric surface; or that the formation of the cobalt film on the copper surface is thermodynamically or kinetically favorable relative to the formation of a cobalt film on the dielectric surface.

One strategy to achieve selective deposition employs the use of blocking layers in which a blocking layer is formed on substrate materials upon which deposition is to be avoided with negligible impact to the target substrate material. A film can be deposited on the target substrate material while deposition on other substrate materials is "blocked" by the blocking layer. The blocking layer can be optionally removed without net adverse effects to the deposited film.

Some embodiments of the disclosure incorporate a blocking layer typically referred to as a self-assembled monolayer (SAM) or SAM layer. A self-assembled monolayer (SAM) consists of an ordered arrangement of spontaneously assembled organic molecules (SAM molecules) adsorbed on a surface. These molecules are typically comprised of one or more moieties with an affinity for the substrate (head group) and a relatively long, inert, linear hydrocarbon moiety (tail group). Fundamentally, SAM molecules are surfactants which have a hydrophilic functional head with a hydrophobic carbon chain tail.

In this case, SAM formation happens through fast adsorption of molecular head groups at the surface and slow association of molecular tail groups with each other through van der Waals interactions. SAM precursors are chosen such that the head group selectively reacts with the substrate materials to be blocked during deposition. Deposition is then performed, and the SAMs can be removed through thermal decomposition (with desorption of any byproducts) or an integration-compatible ashing process.

Fundamentally the SAM growth on a surface is a chemisorption process. Determined by chemisorption kinetics, the coverage of a SAM layer follows the Elovich equation $$\frac{d_q}{d_t} = \alpha \exp(-\beta q)$$

where q is the amount of chemisorption, t is time, $\alpha$ is the initial rate of chemisorpotion (mmol/g-min) and $\beta$ is the desorption constant (g/mmol). Accordingly the coverage of a blocking layer as the function of time follows an asymptotic trend. As a result, the selectivity of ALD depositions typically follows a similar trend as well (i.e. as coverage increases, selectivity also increases).

As a general rule, the selectivity of SAM-based deposition processes depends on the coverage of the SAM blocking layer. Yet there are several factors which may impact the selectivity of a given process. Typical ALD processes utilize small metal precursors which are more likely to be easily volatilized into the reaction chamber. Without being bound by theory, unless coverage is nearly complete, these small metal precursors are able to adsorb to the substrate surface through gaps or defects in the blocking layer leading to deposition on the protected surface, thereby reducing selectivity and increasing the likelihood of device failure. In order to maximize selectivity, typical selective deposition techniques require extended exposure times (measured in hours and days). These extended processing times decrease device throughput.

Additionally, the coverage of the SAM may be affected by exposure to the deposition reactants or certain process conditions during deposition as well. For example, a SAM layer may become degraded by exposure to harsh oxidants. Without being bound by theory, these oxidants may react with the hydrophobic carbon tail groups to form reactive —OH terminations. As these terminations increase in density on the SAM, it may be possible for certain reactions which were previously thermodynamically unfavorable on the SAM surface to become more favorable. This shift in dynamics can lead to nucleation or deposition on the SAM and results in a loss of selectivity. Notably, this loss in selectivity may occur without any change in coverage.

Some embodiments of the disclosure provide methods of selective deposition which advantageously provide similar selectivity with lower levels of coverage and require shorter SAM exposure times through the use of larger metal precursors which are less able to adsorb to the substrate surface through gaps or defects in the blocking layer.

Referring to FIG. 1, one or more embodiment of the disclosure is directed to a processing method 100. A substrate 105 is provided with a first material 110 and a second material 120. The first material 110 has a first surface 112 and the second material 120 has a second surface 122. The first surface and the second surface may also be referred to as the first material surface and the second material surface.

In some embodiments, the first material 110 comprises a metal oxide or a dielectric material and the second material comprises a metal or silicon. In some embodiments, the first material comprises or consists essentially of silicon dioxide ($SiO_2$).

In some embodiments, the second material comprises a metal oxide or a dielectric material and the first material comprises a metal or silicon. In some embodiments, the second material comprises or consists essentially of silicon dioxide ($SiO_2$).

In some embodiments, the first material 110 comprises a dielectric material and the second material 120 comprises a conductive material. In some embodiments, the first material 110 comprises a conductive material and the second material 120 comprises a dielectric material. In some embodiments, the dielectric material comprises one or more of silicon oxide, silicon nitride or silicon carbide. In some embodiments, the conductive material comprises one or more of ruthenium, copper or cobalt. In some embodiments, the first surface comprises a dielectric material consisting essentially of silicon nitride and the second surface conductive material consisting essentially of ruthenium. As used in this specification and the appended claims, the term "consists essentially of" means that greater than or equal to about 95%, 98%, 99% or 99.5% of the specified material is the stated material.

The first surface 112 is exposed to a blocking compound to selectively form a blocking layer 130 on at least a portion of the first surface 112 over the second surface 122. In some embodiments, the blocking layer 130 contains defects 131 that expose portions 114 of the first surface 112.

The substrate may be exposed to the blocking compound by any suitable process. In some embodiments, the substrate is exposed to the blocking compound by a chemical vapor deposition (CVD) process. In some embodiments, the substrate is exposed to the blocking compound by an ALD process. In some embodiments, the substrate is exposed to the blocking compound by an immersion or "wet" process.

The blocking compound may be any compound capable of selectively forming a blocking layer on the first surface over the second surface. The blocking compound comprises at least one blocking molecule. In some embodiments, the blocking molecule has the general formula A-L, where A is a reactive head group and L is a carbonaceous tail group. In some embodiments, the blocking molecule comprises or consists essentially of n-octadecyltris(dimethylamino)silane.

As used in this manner, the "head group" is a chemical moiety that associates with the first surface 112 and the "tail group" is a chemical moiety that extends away from the first surface 112.

In some embodiments, the first material 110 comprises a metal oxide or a dielectric material and A is selected from the group consisting of $(R_2N)_3Si$—, $X_3Si$— and $(RO)_3Si$—, where each R is independently selected from C1-C6 alkyl, C1-C6 cycloakyl and C1-C6 aryl, and each X is independently selected from halogens.

In some embodiments, the first material 110 comprises a metal, silicon, or conductive material and A is selected from the group consisting of $(HO)_2OP$—, HS— and $H_3Si$—.

Some of the reactive head groups listed above comprise more than one reactive moiety in a single reactive head group (e.g. $H_3Si$— may bond up to three times with the surface) which is attached to tail group, L. In some embodiments, A is selected from reactive groups where less than the number of reactive moieties listed above and is attached to more than one tail group, L. In these embodiments, the tail groups may be the same or different.

In some embodiments, L is —$(CH_2)_n CH_3$ and n is an integer from 3 to 24. In some embodiments, the linking group L comprises less than 18 carbon atoms. In some embodiments, the linking group comprises less than 17, 16, 15, 14, 13, 12, 11, 10, 9, 8, 7, 6, or 5 carbon atoms.

In some embodiments, L is —$(CH_2)_n$— and n is an integer from 4 to 18 and a reactive group is on the end of the tail group opposite the head group. In some embodiments, the tail group may be branched with multiple terminations. In some embodiments, the tail group may be substituted with reactive groups in a position other than the end of the tail group. In some embodiments, the tail group may be unsaturated. In some embodiments, the tail group may comprise cycloalkyl or aryl groups.

In some embodiments, the blocking molecule includes a reactive group Z. The reactive group Z of some embodiments is a group comprising one or more reactive moiety selected from alkenes, alkynes, alcohols, carboxylic acids, aldehydes, acyl halides, amines, amides, cyanates, isocyanates, thiocyanates, isothiocyanates, or nitriles.

In some embodiments, the blocking molecule comprises more than one reactive moiety, Z. In some embodiments, A is linked to more than one tail group each terminated with a reactive group, such that a blocking molecule comprises more than one reactive moiety, Z. In some embodiments, L is branched, such that a blocking molecule comprises more than one reactive moiety, Z.

In some embodiments, the blocking molecule comprises more than one reactive moiety and the reactive moieties are positioned in a linear fashion. In some embodiments, L comprises more than one reactive moiety and the reactive moieties are positioned in a branched fashion. As used in this manner, reactive moieties positioned in a linear fashion are positioned within a blocking molecule such than they are positioned within the same carbon chain. In other words, they are positioned end-to-end. As used in this manner, reactive moieties positioned in a branched fashion are positioned within a blocking molecule such than they are positioned on different carbon chains. In other words, they are not positioned end-to-end. In some embodiments, the reactive moieties may be separated by intervening atoms but still be considered end-to-end.

For example, Compound I contains one reactive moiety. Compounds II and III each contain two reactive moieties. Compound II has reactive moieties positioned in a linear fashion. Compound III has reactive moieties positioned in a branched fashion.

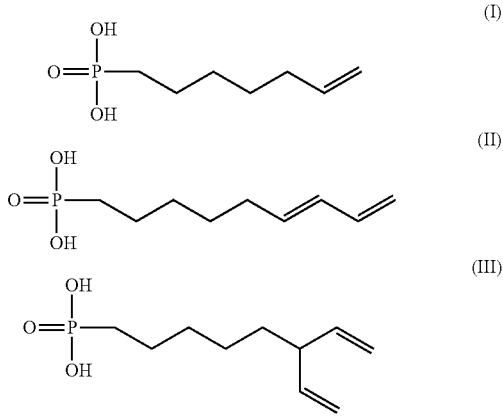

In some embodiments, the tail groups associate with each other through relatively slow van der Waals interaction. In some embodiments, the tail groups can be the same or different so that a homogeneous or heterogeneous SAM can be formed. In some embodiments, the blocking compound comprises at least two different blocking molecules so that a heterogeneous SAM is formed.

The blocking compound can be delivered to the substrate as a single compound or sequential exposures of multiple compounds to form a blocking layer 130. In some embodiments, the first surface 112 is exposed to a single compound that assembles on the surface in an ordered or semi-ordered manner.

In some embodiments, the blocking layer 130 contains defects 131. A defect 131 is a gap or void in the blocking layer where no blocking molecule has reacted with the first surface 112 to inhibit subsequent deposition. The defects expose portions 114 of the first surface 112, referred to herein as exposed portions 114 of the first surface 112.

One skilled in the art will understand that after forming the blocking layer 130, the first surface 112 may have exposed portions 114 as well as covered portions or blocked portions. In some embodiments, the portion of the first surface covered by the blocking layer is greater than or equal to about 80%, or greater than or equal to about 85%, or greater than or equal to about 90%, or greater than or equal to about 95%, or greater than or equal to about 98%, or greater than or equal to about 99%, or greater than or equal to about 99.5%, or greater than or equal to about 99.9% of the first surface 112 on a cross sectional area basis.

After formation of the blocking layer 130, a metal-containing layer 115 is formed on the second surface 122. In some embodiments, the metal-containing layer is formed by sequentially exposing the substrate 105 to a metal precursor and a reactant. The metal-containing layer 115 may be deposited by any suitable process. In some embodiments, the metal-containing layer 115 is deposited by CVD. In some embodiments, the metal-containing layer 115 is deposited by ALD. In some embodiments, the metal-containing layer 115 is deposited by exposing the substrate to a plurality of reactants. In some embodiments, the plurality of reactants is exposed to the substrate sequentially. In some embodiments, the plurality of reactants is exposed to the substrate separately. In some embodiments, the plurality of reactants is separated temporally. In some embodiments, the plurality of reactants is separated spatially.

The amount of the metal-containing layer 115 formed on the first surface 112 is less than the amount of the film formed on the second surface 122. A measurement of the amount of metal-containing layer 115 formed on the surfaces can be the average thickness of the metal-containing layer formed on each surface. In some embodiments, the metal-containing layer 115 has a first average thickness on the first surface 112 and a second average thickness on the second surface 122. Described differently, the formation of the metal-containing layer 115 may be described as selectively forming a metal-containing layer 115 on the second surface 122 over the first surface 112.

The metal precursor can be any suitable precursor with a relatively large diameter. In some embodiments, the metal precursor has a kinetic diameter of greater than or equal to about 20.5 angstroms, or greater than or equal to about 21.0 angstroms, or greater than or equal to about 21.5 angstroms, or greater than or equal to about 22.0 angstroms, or greater than or equal to about 22.5 angstroms, or greater than or equal to about 23.0 angstroms, or greater than or equal to about 23.5 angstroms, or greater than or equal to about 24 angstroms, or greater than or equal to about 25 angstroms, or greater than or equal to about 26 angstroms, or greater than or equal to about 27 angstroms, or greater than or equal to about 28 angstroms.

In some embodiments, the metal precursor comprises a period 3 metal. In some embodiments, the metal precursor comprises a period 4 metal. In some embodiments, the metal precursor comprises a period 5 metal. In some embodiments, the metal precursor comprises a period 6 metal. As used in this regard, a group X metal is any metal or metalloid from the corresponding row or period of the periodic table. Accordingly, period 3 metals have atomic numbers from 11-14. Period 4 metals have atomic numbers from 19-33. Period 5 metals have atomic numbers from 37-52. Period 6 metals have atomic numbers from 55-84. Without being bound by theory, it is believed that metals from higher periods will generally have larger kinetic diameters, leading to metal precursors with larger kinetic diameters.

In some embodiments, the metal precursor comprises one or more of Al, Hf, Zr, Y, Ti, Ta, Si, Cu, Co, W, or Ru. In some embodiments, the metal precursor comprises or consists essentially of tri-tertbutyl aluminum or tri-neopentyl aluminum. In some embodiments, the metal precursor comprises or consists essentially of tetrakis(dimethylamido)titanium or tetrakis(diethylamido)titanium.

Without being bound by theory, it is believed that these metal precursors are relatively larger in kinetic diameter than other precursors typically used for deposition of these metals. Therefore, despite defects 131 in the blocking layer 130, methods which utilize these precursors are more selective than smaller, conventional precursors like trimethylaluminum or titanium tetrachloride.

One skilled in the art will recognize that a molecular diameter is the distance between farthest atoms, whereas the kinetic diameter also includes effects of the electron cloud, which can extend substantially farther in space than the atoms, effectively making the molecule larger.

Kinetic diameter can be calculated based on a molecular electronic volume. The molecular electronic volume is defined as the volume inside a contour of 0.001 electrons/Bohr$^3$ density. Assuming that the volume is spherical, a kinetic diameter can be calculated.

In some embodiments, the metal-containing layer 115 comprises metal atoms and oxygen atoms, nitrogen atoms, carbon atoms, or combinations thereof. In some embodiments, the metal-containing layer 115 comprises a metal oxide. In some embodiments, the metal-containing layer 115 comprises a metal nitride. In some embodiments, metal-containing layer 115 comprises a metal carbide. As used in this regard, a metal oxide is any material comprising a metal or silicon atoms and oxygen atoms. The metal oxide may or may not comprise a stoichiometric ratio of metal to oxygen. Similarly, a metal nitride comprises metal or silicon atoms and nitrogen atoms and a metal carbide comprises metal or silicon atoms and carbon atoms, both without any predefined atomic ratio.

In some embodiments, the metal-containing layer comprises oxygen atoms and the reactant comprises one or more of water, alcohol, oxygen gas ($O_2$), ozone or peroxide. In some embodiments, the reactant consists essentially of water.

In some embodiments, the metal-containing layer comprises nitrogen atoms and the reactant comprises one or more of nitrogen gas ($N_2$), ammonia, hydrazine, hydrazine derivatives, $N_2O$ or $NO_2$. In some embodiments, the reactant consists essentially of nitrogen gas or ammonia.

In some embodiments, the metal-containing layer comprises a pure metal film. As used in this regard, a "pure" metal film comprises greater than 95%, 98%, 99% or 99.5% metal atoms on an atomic basis. In some embodiments, the reactant comprises or consists essentially of hydrogen gas ($H_2$).

Some embodiments of the disclosure provide methods to selectively deposit metal oxide materials which advantageously provide increased selectivity through the use of alcohols as oxidizing reactants which are less likely to degrade the blocking layer.

Figure 2:
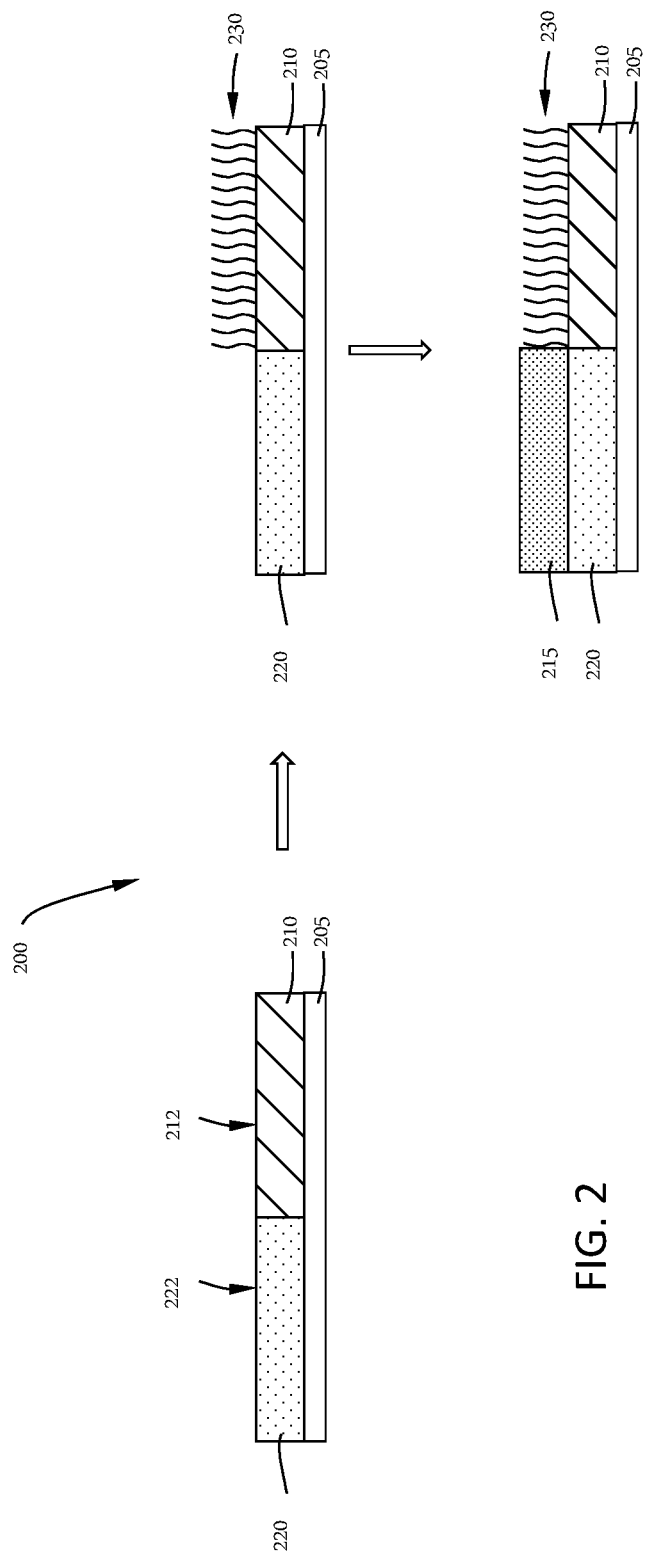
FIG. 2 illustrates a processing method in accordance with one or more embodiment of the disclosure.

Referring to FIG. 2, one or more embodiment of the disclosure is directed to a processing method 200. A substrate 205 is provided with a first material 210 and a second material 220. The first material 210 has a first surface 212 and the second material 220 has a second surface 222. The first surface and the second surface may also be referred to as the first material surface and the second material surface.

In some embodiments, the first material 210 comprises a metal oxide or a dielectric material and the second material comprises a metal or silicon. In some embodiments, the first material comprises or consists essentially of silicon dioxide ($SiO_2$).

In some embodiments, the first material 210 comprises a dielectric material and the second material 220 comprises a conductive material. In some embodiments, the first material 210 comprises a conductive material and the second material 220 comprises a dielectric material.

In some embodiments, the dielectric material comprises one or more of silicon oxide, silicon nitride or silicon carbide. In some embodiments, the conductive material comprises one or more of silicon or a metal. In some embodiments, the dielectric material consists essentially of silicon oxide and the conductive material consists essentially of silicon. As used in this specification and the appended claims, the term "consists essentially of" means that greater than or equal to about 95%, 98%, 99% or 99.5% of the specified material is the stated material.

The substrate 205 is exposed to a blocking compound to selectively form a blocking layer 230 on at least a portion of the first surface 212 over the second surface 222. The blocking compound and the blocking layer may be any suitable blocking compound or blocking layer as described elsewhere herein.

After formation of the blocking layer 230, a metal oxide layer 215 is formed on the second surface 222. In some embodiments, the metal oxide layer 215 is formed by sequentially exposing the substrate 205 to a metal precursor and an oxygenating agent. Stated differently, in some embodiments, the metal oxide layer 215 is deposited by ALD. In some embodiments, the metal oxide layer 215 is deposited by exposing the substrate to a plurality of reactants. In some embodiments, the plurality of reactants is exposed to the substrate sequentially. In some embodiments, the plurality of reactants is exposed to the substrate separately. In some embodiments, the plurality of reactants is separated temporally. In some embodiments, the plurality of reactants is separated spatially.

The amount of the metal oxide layer 215 formed on the first surface 112 is less than the amount of the layer formed on the second surface 222. A measurement of the amount of metal oxide layer 215 formed on the surfaces can be the average thickness of the metal oxide layer formed on each surface. In some embodiments, the metal oxide layer 215 has a first average thickness on the first surface 212 and a second average thickness on the second surface 222. Described differently, the formation of the metal oxide layer 215 may be described as selectively forming a metal oxide layer 215 on the second surface 222 over the first surface 212.

The metal precursor can be any suitable precursor. In some embodiments, the metal precursor comprises one or more of Al, Hf, Zr, Y, Ti, Ta, Si, Cu, Co, W, or Ru. In some embodiments, the metal precursor comprises hafnium. In some embodiments, the metal precursor comprises or consists essentially of tris(dimethylamido)cyclopentadienyl hafnium. In some embodiments, the metal precursor comprises or consists essentially of tetrakis(ethylmethylamino) hafnium.

The oxygenating agent can be selected to improve selectivity. The inventors have found that using oxygenating agents which are relatively lower oxidation potential (i.e. higher pKa values) provides increased selectivity. In some embodiments, the oxygenating agent has a pKa greater than the pKa of water. In some embodiments, the oxygenating agent has a pKa greater than or equal to about 14.0 at 25° C. As used in this specification and the appended claims, the pKa of any stated compound or species is measured at 25° C. and 1 atm pressure. In some embodiments, the pKa of the oxygenating agent is in the range of about 15.8 to about 20, or in the range of about 16 to about 18. In some embodiments, the oxygenating agent has a pKa greater than or equal to about 15.7. In some embodiments, the oxygenating agent comprises substantially no water. In some embodiments, the oxygenating agent comprises substantially no oxygen ($O_2$).

In some embodiments, the oxygenating agent comprises substantially no ozone ($O_3$). As used in this manner, the phrase "substantially no" means that the oxygenating agent comprises less than or equal to about 5%, 2%, 1% or 0.5% of the stated species on a molar basis.

In some embodiments, the oxygenating agent comprises an alcohol. In some embodiments, the oxygenating agent is of the general formula R—OH, where R is an alkyl or cycloalkyl group comprising 1 to 8 carbons. In some embodiments, R is not an aryl group (e.g., benzyl group).

In some embodiments, the oxygenating agent comprises one or more of: methanol, ethanol, propanol, isopropanol, butanol, sec-butanol or t-butanol. In some embodiments, the oxygenating agent consists essentially of t-butanol.

In some embodiments, the sequential exposure of the substrate to a metal precursor and an oxygenating agent is repeated until a predetermined thickness of metal oxide layer is formed on the first surface. In some embodiments, the sequential exposure of the substrate to a metal precursor and an oxygenating agent is repeated until substantial deposition of the metal oxide layer is observed on the blocking layer. As used in this regard, "substantial deposition" refers to the nucleation or other deposition of metal oxide which is observable by SEM.

In some embodiments, the predetermined thickness of metal oxide is formed without substantial deposition on the blocking layer. In some embodiments, the predetermined thickness is greater than or equal to about 60 Å, greater than or equal to about 80 Å, greater than or equal to about 90 Å, or greater than or equal to about 100 Å.

Without being bound by theory, it is believed that the oxygenating agents disclosed herein have a lower oxidation potential than water or oxygen. Accordingly, it is believed that these oxygenating agents minimize metal oxidation, corrosion and particle issues, and are less corrosive or otherwise damaging to the SAM layer. Therefore, it is possible to perform a greater number of deposition cycles and achieve a greater thickness of metal oxide with these oxygenating agents.

The inventors have observed experimentally that deposition of hafnium oxide on a blocked surface occurs after approximately 50 cycles when formed using a hafnium precursor and water. Yet, when a similar process is performed with t-butanol, no deposition is observed for about 150 cycles. Stated differently, when formed with t-butanol, the inventors are able to deposit about 85-100 Å of hafnium oxide on a silicon surface without substantial deposition on a blocked silicon oxide surface. Yet, when performed with water, the inventors are only able to deposit 30-40 Å before deposition is observed on the blocked surface.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A selective deposition method comprising:
providing a substrate with a first surface comprising a conductive material and a second surface comprising a dielectric material;
exposing the substrate to a blocking compound to selectively form a blocking layer on at least a portion of the first surface over the second surface; and
sequentially exposing the substrate to a metal precursor comprising tri-neopentyl aluminum and a reactant to selectively form a metal-containing layer on the second surface over the blocking layer or the first surface.

2. The method of claim 1, wherein the blocking compound comprises a blocking molecule with a reactive head group and a carbonaceous tail group, the reactive head group selected from the group consisting of $(HO)_2O$—, HS— and $H_3Si$—.

3. The method of claim 1, wherein the metal precursor further comprises tri-tertbutyl aluminum.

4. The method of claim 1, wherein the metal-containing layer comprises metal atoms and oxygen atoms, nitrogen atoms, carbon atoms, or combinations thereof.

5. The method of claim 4, wherein the metal-containing layer comprises oxygen atoms and the reactant comprises one or more of water, alcohol, oxygen gas ($O_2$), ozone or peroxide.

6. The method of claim 4, wherein the metal-containing layer comprises nitrogen atoms and the reactant comprises one or more of nitrogen gas ($N_2$), ammonia, hydrazine, hydrazine derivatives, $N_2O$ or $NO_2$.

7. The method of claim 1, wherein the metal-containing layer comprises a pure metal film.

8. The method of claim 7, wherein the reactant comprises one or more of hydrogen gas ($H_2$).

9. The method of claim 1, wherein the portion of the first surface covered by the blocking layer is greater than or equal to about 90% of the first surface.

10. A selective deposition method comprising:
providing a substrate with a first surface and a second surface;
exposing the substrate to a blocking compound to selectively form a blocking layer on at least a portion of the first surface over the second surface; and
sequentially exposing the substrate to a metal precursor and a reactant to selectively form a metal-containing layer on the second surface over the blocking layer or the first surface, the metal precursor comprising tri-neopentyl aluminum.

11. The method of claim 10, wherein the first surface comprises a dielectic material and the second surface comprises a conductive material.

12. The method of claim 11, wherein the blocking compound comprises a blocking molecule with a reactive head group and a carbonaceous tail group, the reactive head group is selected from the group consisting of $(R_2N)_3Si$—, $X_3Si$— and $(RO)_3Si$—, where each R is independently selected from C1-C6 alkyl, C1-C6 cycloakyl and C1-C6 aryl, and each X is independently selected from halogens.

13. The method of claim 10, wherein the metal precursor further comprises tri-tertbutyl aluminum.

14. The method of claim 10, wherein the metal-containing layer comprises metal atoms and oxygen atoms, nitrogen atoms, carbon atoms, or combinations thereof.

15. The method of claim 14, wherein the metal-containing layer comprises oxygen atoms and the reactant comprises one or more of water, alcohol, oxygen gas ($O_2$), ozone or peroxide.

16. The method of claim 14, wherein the metal-containing layer comprises nitrogen atoms and the reactant comprises one or more of nitrogen gas ($N_2$), ammonia, hydrazine, hydrazine derivatives, $N_2O$ or $NO_2$.

17. The method of claim 10, wherein the metal-containing layer comprises a pure metal film.

18. The method of claim 17, wherein the reactant comprises one or more of hydrogen gas ($H_2$).

19. The method of claim 10, wherein the portion of the first surface covered by the blocking layer is greater than or equal to about 90% of the first surface.

20. A selective deposition method comprising:
providing a substrate with a first material surface and a second material surface, the first material comprising $SiO_2$, the second material comprising copper;
exposing the substrate to n-octadecyltris(dimethylamino) silane to selectively form a blocking layer on at least a portion of the first material surface over the second material surface; and
sequentially exposing the substrate to tri-neopentyl aluminum and water to selectively form an aluminum oxide layer on the second material surface over the blocking layer and over the first material surface.

* * * * *